UNIPOLAR-BIPOLAR SEMICONDUCTOR AMPLIFIER

Filed May 28, 1962 3 Sheets-Sheet 1

INVENTORS
Hung Chang Lin &
Karl Ka-Chung Yu
BY
Gordon H. Telfer
ATTORNEY

UNIPOLAR-BIPOLAR SEMICONDUCTOR AMPLIFIER

Filed May 28, 1962

3 Sheets-Sheet 2

3,210,677
Patented Oct. 5, 1965

3,210,677

UNIPOLAR-BIPOLAR SEMICONDUCTOR AMPLIFIER

Hung Chang Lin, Monroeville, and Karl Ka-Chung Yu, Pittsburgh, Pa., assignors to Westinghouse Electric Corporation, East Pittsburgh, Pa., a corporation of Pennsylvania Filed May 28, 1962, Ser. No. 197,975
7 Claims. (Cl. 330—17)

This invention relates generally to electronic apparatus for the performance of signal amplification and, more particularly, to monolithic semiconductor devices which achieve audio amplification with a high impedance input.

Of the principal types of transistor amplifier circuits, the common collector or emitter follower connection, wherein the signal is applied to the base and taken from the emitter, has a high input resistance which makes it a desirable circuit to use for the amplification of signals from a high impedance source, such as a ceramic pickup device conventionally used on phonographs. Various modifications of the common collector circuits, such as the Darlington configuration in which two or more transistors are cascaded in the common collector connection, are also useful high impedance amplifiers.

Difficulty is encountered, however, in the biasing of the transistor or transistors used in high input impedance amplifier circuits. In conventionally interconnected circuits, biasing is achieved by individual resistors connected in the circuit. If these resistors have low values, the input resistance of the amplifier is lowered and the effective current gain of the amplifier is reduced. If the biasing resistors are as high or higher than that necessary to match the source impedance, the temperature stability of the transistor is poor since the temperature sensitive saturation current flowing in the resistance will change the bias at the base. If a transistor amplifier circuit equivalent is provided entirely within a monolithic semiconductor device, not only the foregoing problems are encountered, but, in addition, the difficulty is encountered of incorporating high resistances (of the order of 100,000 ohms, for example). Some circuit modifications, such as the bootstrap circuit can achieve a fairly high input impedance but require a high capacitance which is also difficult to incorporate within a monolithic semiconductor device.

In copending application Serial No. 89,497, filed February 15, 1961, by John P. Stelmak, now Patent 3,173,101, issued March 9, 1965, and S.N. 188,188, filed April 17, 1962, by George C. Sziklai, the latter application now abandoned, both of which are assigned to the assignee of the present invention, there were described certain devices providing the functional equivalent of a unipolar transistor and bipolar transistor in series so as to take advantage of the high input impedance of the unipolar transistor and the good current gain of the bipolar transistor. Such devices have not yet attained practical levels of operation because of drawbacks such as a constantly flowing base current in the bipolar transistor of widely varying magnitude which results in variation in collector current of the bipolar transistor. Also, such devices have been generally characterized by poor frequency response.

It is, therefore, an object of the present invention to provide an improved semiconductor amplifier.

Another object is to provide an amplifier having a high input impedance which may be fabricated in a unitary body of semiconductive material and achieve practical levels of performance.

Another object is to provide a semiconductor amplifier wherein temperature stability is provided.

The invention, briefly and without intent to define its exact limits, provides electronic apparatus including two unipolar transistors of which the drain of the first is connected to the source of the second and from this common point the input signal to a bipolar transistor amplifier is derived. A high impedance input signal, such as from a ceramic pickup device, for example, is applied to the gate of the unipolar transistor whose source is at the common point. The other unipolar transistor provides a constant current at the common point due to operating it in the pinch-off region of its characteristic curve. The common point assumes a potential nearly the same as the gate to which the input signal is applied and the base biasing voltage applied to the dipolar transistor is relatively constant.

An amplifier such as that just briefly described can be formed of individually interconnected components or within a monolithic semiconductor device. Monolithic semiconductor devices or functional blocks in which an entire circuit function is integrated within a unitary body of semiconductive material have advantages of increasing reliability, reducing size and reducing cost over the equivalent conventional circuit. In the present instance, since the two unipolar transistors must have closely matching characteristics, that is, the pinch-off current of each must be about the same, it is particularly advantageous to fabricate the device in a functional block since in this way the identical processing to which the block is subjected insures matched characteristics of the unipolar transistors. It is, therefore, at least desirable that the unipolar elements be fabricated in the same block in which the other one or more bipolar transistors may also be included as desired.

Furthermore, by using unipolar transistor structures for bipolar transistor biasing, the circuit equivalent may be incorporated within a monolithic semiconductive device relatively easily and achieve stable operation.

The present invention, both as to its organization and manner of operation, together with the above-mentioned and further objects and advantages thereof, may best be understood by reference to the following description, taken in connection with the accompanying drawings in which.

Figure 1:
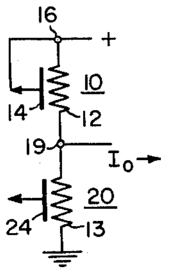
FIGURE 1 is a circuit schematic of a pair of unipolar transistor means connected in accordance with the present invention.
Figure 2:
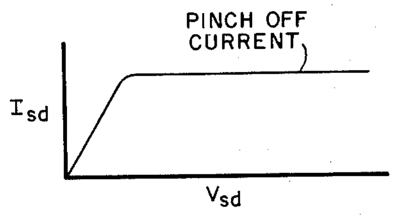
FIG. 2 is a current-voltage characteristic curve for a unipolar transistor.

Referring to FIG. 1, there is shown a pair of unipolar transistors 10 and 20 connected in series. It will be understood that a unipolar transistor, also called a field-effect transistor, is a known device in which a working current of majority carriers enters semiconductive material from a first contact called the source and leaves the semiconductive material through a second contact called the drain. The source and drain contacts are both generally ohmic contacts. A rectifying contact called the gate, on the semiconductive region through which the current passes, controls the magnitude of the current between the source and drain by reason of the creation of a depletion layer at the rectifying junction upon application of a reverse bias thereto. The portion of the semiconductive material through which the current passes is called the channel and it will vary in effective size depending upon the magnitude of the reverse bias applied to the gate. When a sufficient reverse bias voltage, called the pinch-off voltage, is applied to the gate, the depletion layer extends across the channel. The bias polarity indicated in FIG. 1 is for the case in which the unipolar transistors have p-type channels 12 and 22 with n-type gate regions 14 and 24 thereon. Because the source 16 of the first unipolar transistor 10 is shorted to the gate 14, the first unipolar transistor 10 will pass only a constant current called the pinch-off current regardless of variation in the source to drain voltage. This same result is obtained so long as the gate 14 is maintained at a fixed reverse potential relative to the source 16. The gate to source short is a convenient way of providing this effect. This characteristic is illustrated in FIG. 2 wherein the abscissa represents the voltage existing between the source and drain while the ordinant represents the current passing from the source to the drain.

The second unipolar transistor 20 has approximately the same pinch-off current as the first unipolar transistor 10 which is large relative to the output current $I_0$. The exact characteristics of the unipolar transistors are not critical so long as the characteristics of unipolar transistors 10 and 20 are relatively well matched. The common point 19 between the two unipolar transistors, at which the drain of the first unipolar transistor 10 is connected to the source of the second unipolar transistor 20, will assume a potential nearly the same as the gate 24 of the second unipolar transistor 20. Therefore, when a signal is applied to the second gate 24, the source of the second unipolar transistor or common point 19 will follow the signal voltage. Since the upper unipolar transistor 10 is a constant current source, having a high A.-C. impedance, it will not load the signal to reduce the available output current or to introduce distortion. Since the input is through the reversed biased gate junction of the second unipolar transistor 20, the input is of high impedance and there is less loading than if the signal were applied at the common point 19 of the unipolar transistors.

Figure 3:
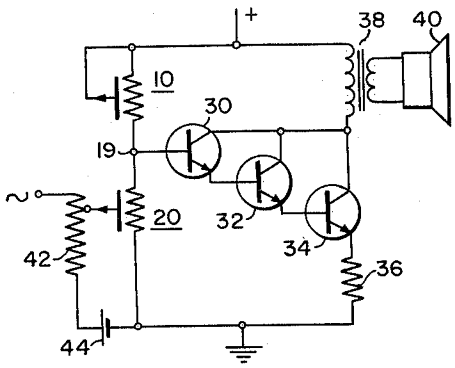
FIG. 3 is a circuit schematic of one embodiment of the present invention.

FIG. 3 shows an example of a complete circuit in accordance with this invention. In addition to the unipolar transistor pair 10 and 20 like that shown in FIG. 1, there are provided three bipolar transistors 30, 32 and 34 in cascade common collector connection off of the common point 19. As a result of conventional transistor operation, the emitter voltage of the third bipolar transistor 34 and, hence, the emitter current through the resistance 36 closely follows the voltage input to the base of the first bipolar transistor 30 and there is provided an output signal applied to a transformer 38 for driving a suitable electroacoustic transducer or loudspeaker 40. The resistance 36, and the corresponding element in the subsequent embodiments, need only be of the order of 1 ohm and may be provided by the resistance of the conductive leads without a separate resistive element. At the input circuit, the input signal is applied to the gate of the second unipolar transistor 20 through a voltage divider 42, such as a conventional variable resistance volume control and the gate is biased positive by the bias potential source 44, which holds the potential at the common point 19 nearly constant against variations in temperature and bipolar transistor parameters.

The circuit of FIG. 3 is suitable when unipolar transistors with p-type channels and n-type gate regions are used in conjunction with n-p-n transistors. However, only slight modification is necessary to employ other conductivity type devices. Of course, if unipolar transistors with n-type channels are used in conjunction with p-n-p transistors the circuit of FIG. 3 is suitable with only a reversal in bias potential being necessary.

Figure 4:
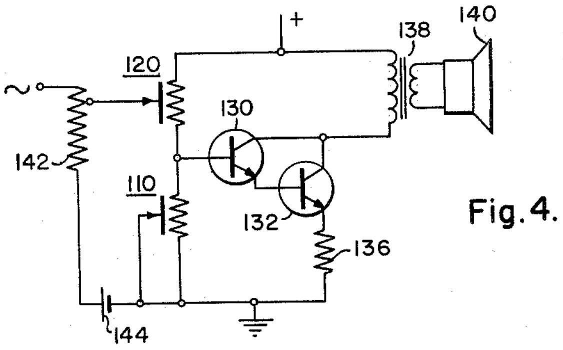
FIG. 4 is a circuit schematic of another embodiment of the present invention.

In FIG. 4 there is shown a circuit employing unipolar transistors 110 and 120 having n-type channels with n-p-n transistors 130 and 132. The circuit is substantially the same as that of FIG. 3 except that the functions of the unipolar transistors are interchanged since the carrier flow in the channel is now in the opposite direction. If unipolar transistors having p-type channels are used together with p-n-p transistors, then the same circuit may be used with a reversal of bias polarity.

It will be noted that while there are three bipolar transistors 30, 32 and 34 in FIG. 3, there are only two bipolar transistors 130 and 132 in the circuit of FIG. 4. However, any number of bipolar transistors may be used as desired.

Figure 5:
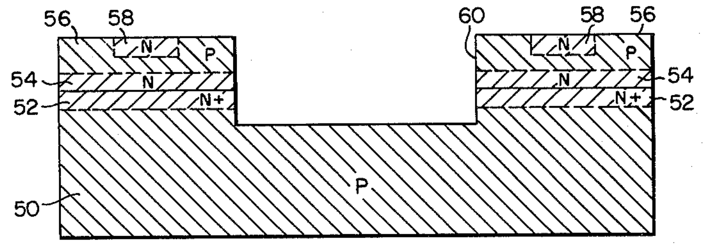
FIG. 5 is a cross-sectional view of a semiconductor device embodying features of the present invention in generalized form.

Referring to FIG. 5, there is shown a generalized cross-sectional view to illustrate how the unipolar transistor elements and bipolar transistor elements may be combined within a unitary body of semiconductor material. This general structure is suitable for incorporating n-p unipolar transistors with n-p-n bipolar transistors or p-n unipolar transistors with p-n-p bipolar transistors. The structure comprises a substrate 50 of one semiconductivity type, here shown as p-type as an example, with a pair of epitaxially grown layers 52 and 54 thereon which are both of opposite semiconductivity type to that of the substrate 50. In the layers 52 and 54 there are formed by double diffusion regions 56 and 58 of first and second semiconductivity types, respectively. A groove 60 etched through the uppermost layers 52, 54, 56 and 58 isolates the unipolar and bipolar portions of the device so that they may operate independently.

Figure 6:
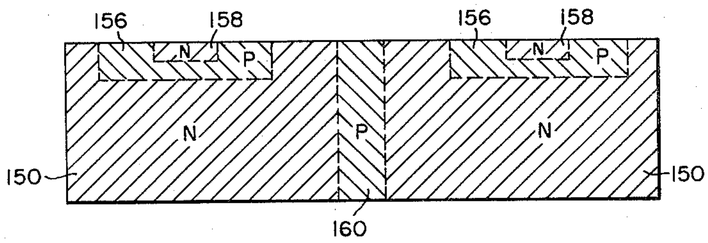
FIG. 6 is a cross-section view of a semiconductor device showing alternative features of the present invention in generalized form.

In FIG. 6 there is shown another generalized structure wherein a substrate 150 of one type, here shown as n-type, with double diffused regions 156 and 158 to provide the unipolar and bipolar regions of the device. Isolation between the unipolar and bipolar portions is provided by an isolating junction formed by deep diffusion of a p-type region 160 through the entire substrate 150.

The generalized structures of FIGS. 5 and 6 are merely representative of some general techniques which may be employed to fabricate devices in accordance with this invention. In each of the structures of FIGS. 5 and 6, the left hand structures may, for example, be used for unipolar functions with regions 54 and 58 as gates and region 56 as a channel. The right hand structure may be used for bipolar functions with region 58 as emitter, region 56 as base and region 54 as collector. An actual device would, of course, comprise an additional unipolar structure and possible additional bipolar structures and would have conductive elements and possibly some resistive elements between the device portions to provide an integrated circuit equivalent.

Figure 7:
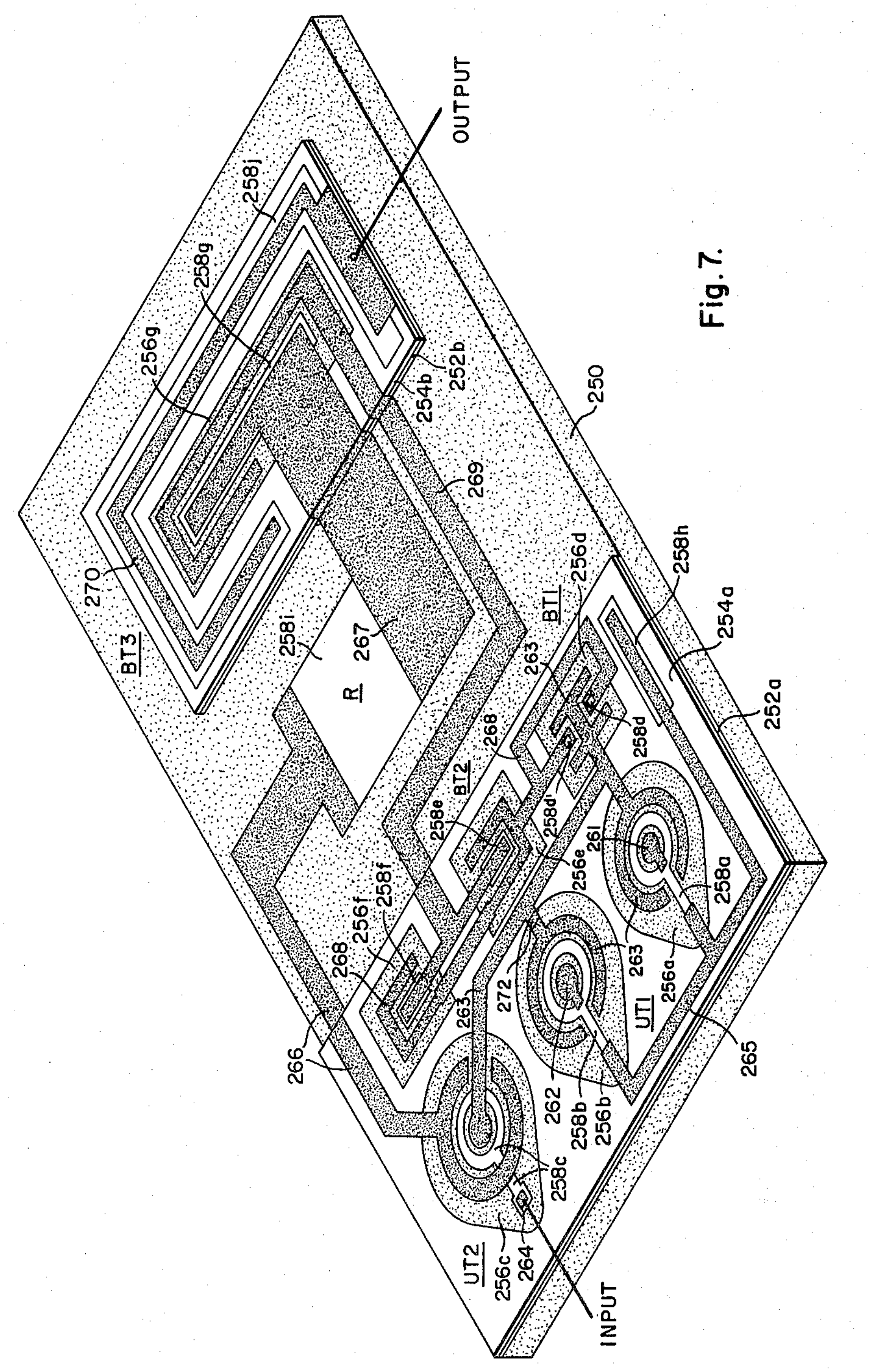
FIG. 7 is a perspective view of a monolithic semiconductor device made in accordance with the present invention; and, FIG. 8 is the approximate equivalent circuit of the device of FIG. 7 plus some additional circuit elements.

Referring to FIG. 7 there is shown a perspective view of an actual amplifier formed in accordance with the present invention. To aid in understanding the device structure and its fabrication, identical reference numerals are given to those semiconductive regions which can be, and preferably are, formed in a single operation while the letters suffixes distinguish the separate portions. This device is formed in accordance with the general features of the structure of FIG. 5 and comprises a p-type substrate 250 having first and second epitaxial n-type layers 252*a* and *b* and 254*a* and *b* thereon. Within the upper layer portion 254*a* there are a plurality of diffused p-type regions 256*a* through *f*. In the upper epitaxial layer portion 254*b* there is a diffused p-type portion 256*g*.

N-type regions 258*a, b, c, e* and *f* are disposed within the p-type regions 256*a, b, c, e* and *f* respectively. N-type regions 258*d* and 258*d'* are both disposed within the p-type region 256*d*. N-type region 258*h* is disposed directly in the upper n-type epitaxial layer portion 254*a*. N-type region 258*g* is disposed within the p-type region 256*g*. N-type region 258*j* is disposed directly in the upper n-type layer portion 254*b*. Another n-type region 258*i* is disposed in the substrate 250.

Figure 8:
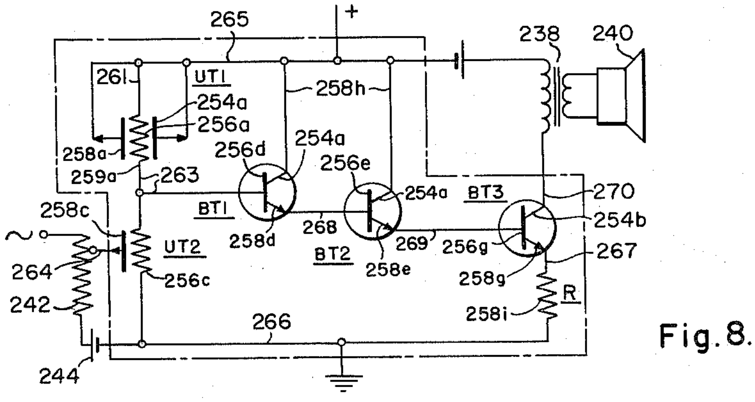

FIG. 8 shows the approximate equivalent circuit of the device of FIG. 7 with some associated elements. Everything shown within the dotted line is provided by the device of FIG. 7. In addition, as the following discussion will show, the device of FIG. 7 provides the functions of other circuit elements which are not connected in the circuit of FIG. 8.

A first unipolar transistor UT1 is provided by either one of two alternative combinations of regions. A first n-p-n structure, of a first gate, a channel and a second gate, includes the regions 254*a*, 256*a* and 258*a*, respectively, and the other structure includes 254*a*, 256*b* and 258*b*, respectively. The p-type regions 256*a* and 256*b* are fabricated of somewhat different size so that they will have slightly different pinch-off currents. Either may be selected for use in the circuit as unipolar transistor UT1.

A second unipolar transistor UT2 with a first gate, a channel and a second gate, is provided by the combination of regions 254*a*, 256*c* and 258*c*, forming an n-p-n structure. Here the dimensions of the p-type region 258*c* are larger than in UT1 in order to ensure that UT2 has a slightly higher pinch-off current than UT1 so that the gate junction will never be forward biased during operation.

A first bipolar transistor BT1 is provided by the collector, base and emitter regions 254*a*, 256*d* and 258*d* and *d'*, respectively, with either one or both of the latter regions being employed as the emitter.

A second bipolar transistor BT2 is provided by the collector, base and emitter regions 254*a*, 256*e* and 258*e*, respectively, or, alternatively, by the regions 254*a*, 256*f* and 258*f*, respectively.

A third bipolar transistor BT3 is provided by the collector, base and emitter regions 254*b*, 256*g* and 258*g*, respectively. The bipolar transistors are of increasing size to allow for increasing power handling capacity.

A resistive region R is provided by the region 258*i*.

By means of metallized contacts and conductive interconections, the various portions of the device are interconnected to provide the operation of the circuit of FIG. 8. All of the contacts and interconnections may be, and preferably are, formed in a single operation confined to the upper surface of the device. Where contacts extend over a p-n junction between regions of opposite conductivity type, the junction is insulated from the contact, for example by an oxide layer (not shown), except as indicated below.

The contacts and conductive interconnections include:

unipolar (UT1) source contacts 261 and 262 on the center of p-type regions 256*a* and 256*b* and shorted to gate regions 258*a* and 258*b*;

contact 263 providing drain contacts on UT1, a source contact on UT2 and a base contact on BT1;

contact 264 providing an input gate contact to UT2;

contact 265 providing gate contact to UT1 and connecting to region 258*h* to make conductive connection between the gate regions 258*a* and *b* and the layer 254*a*;

contact 266 providing a drain contact on UT2 and conductive connection to R;

contact 267 providing an emitter contact on BT3 and conductive connection to R;

contact 268 providing emitter contacts on BT1 and base contacts on BT2;

contact 269 providing emitter contacts on BT2 and base contacts on BT3; and contact 270 providing an output collector contact on BT3.

As mentioned in the preceding discussion, the functions of UT1, BT1 and BT2 may be provided in alternative ways in the device of FIG. 7. The provisions of alterative structures is a convenient way to ensure satisfactory operation of the completed device because if variation occurs in the formation of the semiconductor regions some choice is permitted in determining which are to be employed. As mentioned, the structures which may comprise UT1 are intentionally of varying size to provide a choice of characteristics. The structure not selected for use in the device may be effectively removed, after fabrication and testing, merely by separating the contact 263 near the portion on the p-type region 256*b* as shown at 272. The structures which may comprise BT1 and BT2 are shown fully connected and they may be operated in this manner or some regions may be isolated by severing contacts at appropriate places. It is to be understood that the redundancy in the device of FIG. 7 is merely exemplary and that other alternative regions may be provided or some of those shown may be omitted.

As shown the unipolar transistor structures have two gate regions. For example, the structure which provides the function of UT1 has an upper gate region provided by the region 258*a* and a lower gate region provided by part of the continuous layer 254*a* which are interconnected through the contact 265 and the highly doped region 258*h*, which also serves as a common point for the collectors of BT1 and BT2. Since both gates of UT1 are shorted to the source by contact 261, this structure is quite satisfactory and in some cases desirable for establishing pinch-off in UT1. UT2 includes two regions which could provide gate functions, namely, region 258*c* and part of the layer 254*a*. The upper gate 258*c* to which the input signal is applied should, however, not be connected to the layer 254*a* because to do so would shunt the input signal to ground potential. For the same pinch-off currents in UT1 and UT2, the lower gate of UT2 should be biased to the same potential as the source potential of UT2. If the lower gate of UT2 is biased to a potential more positive than the source of UT2, then the pinch-off current of UT2 may fall below that of UT1 and causes malfunction of the amplifier. It is preferable that the portion of layer 254*a* under the region 256*c* be isolated from the rest of the layer 254*a*. This may be effected by various means such as etching through the layer 254*a* in a ring around UT2 or by diffusing a ring around UT2 of p-type semiconductivity down to the substrate 250. A lower gate in UT2 is not shown in FIG. 8.

It will be noted that the circuit of FIG. 8 differs somewhat from those of FIGS. 3 and 4 principally in that all three bipolar transistors do not have a common collector connection. The collector of BT3 (the output of the device of FIG. 7) goes to one side of the transformer 238 while the collectors of BT1 and BT2 go to a fixed positive voltage. This circuit modification is useful in order to reduce the voltage drop which must be sustained by the junctions of BT1 and BT2. The input, including, a bias source 244 and variable resistance volume control are substantially as in FIG. 3.

Merely as an example, the invention is described as applied to a semiconductive body of silicon. In addition to silicon, however, other semiconductive materials such as germanium or a semiconductive compound are suitable. For example, a compound of substantially stoichiometric proportions of elements from Group III of the Periodic Table such as gallium, aluminum, and indium and elements from Group V of the Periodic Table, such as arsenic, phosphorus and antimony may be used. Examples of suitable Group III–V stoichiometric compounds include gallium arsenide, gallium antimonide, gallium phosphide, indium arsenide and indium antimonide. A compound of two elements of Group IV of the Periodic Table such as silicon carbide or a compound of an element of Group III of the Periodic Table and an element of Group VI of the Periodic Table such as cadmium sulfide are further examples of suitable materials.

In describing the invention, devices are shown in which a particular type of semiconductivity is ascribed to each semiconductive region. However, the semiconductivity of the various regions may be reversed from that shown. Also, the inclusion of additional structural features within the same block of material is satisfactory if the essential topological characteristics of the described regions are retained.

There will now be described by way of example a typical device in accordance with this invention as shown in FIG. 7. A starting wafer or die may be prepared by any of the known methods. For example, a suitable substrate 10 is a cut and lapped wafer from a drawn single crystal silicon rod or a section of a dendritic crystal prepared in accordance with U.S. Patent 3,031,403, issued April 24, 1962, the assignee of which is the same as that of the present invention.

A suitable starting substrate 250 was a wafer about 150 mils by 250 mils by 10 mils and was of p-type material having a resistivity of about 20 ohm-cm. On one major surface of the substrate there are formed first and second epitaxial layers 252 and 254 by thermal decomposition of a silicon compound. The first n-type epitaxial layer 252 has a thickness of about 0.5 mil and a low resistivity of about 0.005 ohm-cm. The second n-type epitaxial layer 254 has a thickness of about 0.5 mil and a resistivity of about 1 ohm-cm. The first and second epitaxial layers are etched through to provide two separate portions with regions 252*a* and 254*a* in one portion and 252*b* and 254*b* in the other. Then using suitable oxide masking and photoresist techniques, selective diffusion is carried out to form the p-type regions 256. This is done by using boron or any other suitable acceptor type impurity, and diffusing to provide a surface concentration of about $5\times10^{17}$ atoms per cubic centimeter. Subsequently, after performing other masking operations, phosphorus or another suitable donor type impurity is diffused to provide the n-type regions 258 with a surface concentration of about $10^{20}$ atoms per cubic centimeter.

Then the device is oxidized by exposure of the device to water vapor at a high temperature to form a layer (not shown) of silicon dioxide of a few thousands of Angstroms in thickness. Again using suitable masking techniques, the oxide is selectively removed so that it covers all exposed P-N junctions and surface area except where the contacts 261 to 270 are to be placed in direct contact with the semiconductive material.

After oxidation, the device is metallized, for example, by evaporation of aluminum in a vacuum with subsequent alloying to form the contacts 261 through 270. Then leads are affixed to the input and output contacts 264 and 270, respectively, by thermocompression bonding and the device is encapsulated in a hermetic enclosure of metal or ceramic material, for example. Additional leads are similarly provided as required to permit connection of the device in the circuit of FIG. 7.

For the device of FIG. 7 made in the manner just described, the following approximate area dimensions are suitable to provide a satisfactory device:

| | Mils |
|---|---|
| Substrate **250** | 150 by 250. |
| Layers **252***a* and **254***a* | 150 by 75. |
| Layers **252***b* and **254***b* | 100 by 50. |
| p-Type region **256***a* | 30 diam. |
| p-Type region **256***b* | 36 diam. |
| p-Type region **256***c* | 44 diam. |
| p-Type regions **256***d, e* and *f* | 22 x 27. |
| p-Type region **256***g* | 84 x 28. |
| n-Type regions **258***a, b* and *c* | 18 outside diam., 5 strip width. |
| n-Type regions **258***d* and *d'* | 5 by 4. |
| n-Type regions **258***e* and *f* | 6 by 12. |
| n-Type region **258***g* | 10 by 60. |
| n-Type region **258***h* | 8 by 32. |
| n-Type region **258***i* | 68 x 36. |
| n-Type region **258***j* | 8 width; 266 total length. |

The contacts 261 through 270 range in width from about 5 mils to about 15 mils.

The preceding description is applicable to the fabrication of one device or of many devices which may all be fabricated on a single wafer at the same time and subsequently separated.

Typical characteristics achieved with a device such as that just described include an input resistance of about 300,000 ohms using a half volt input signal and a power output of 2½ to 3 watts with less than 5% distortion.

While the present invention has been shown and described in certain forms only, it will be obvious to those skilled in the art that it is not so limited but is susceptible of various changes and modification without departing from the spirit and scope thereof.

What is claimed is:

1. In an operating circuit of a bipolar transistor amplifier, the combination comprising: bipolar transistor means having a base, a collector and an emitter; and means to bias said bipolar transistor means and to provide a high input impedance including first and second unipolar transistor means, said first unipolar transistor means electrically coupled between said base and said collector and said second unipolar transistor means electrically coupled between said base and said emitter; each of said unipolar transistor means having a gate, a source and a drain, input contact means for applying an input signal to the gate of the one of said unipolar transistor means having the source thereof connected to said base, and output contact means to derive an output signal from said collector.

2. Electronic apparatus capable of amplifying a high impedance input signal comprising: first and second unipolar transistor means and a bipolar transistor means; each of said unipolar transistor means having a channel region and a gate region forming a p-n junction with said channel region; means to make contact to each of said gate regions to provide first and second gate contacts and to two separate portions of each of said channel regions to provide a first source contact and a first drain contact on said first unipolar transistor means and a second source contact and a second drain contact on said second unipolar transistor means; said bipolar transistor means having a base region and emitter and collector regions each forming a p-n junction with said base region; means to make contact to each of said base, emitter and collector regions to provide base, emitter and collector contacts; means to conductively connect said first gate contact to said first source contact; means to conductively connect said first drain contact to said second source contact to provide a common point and means to electrically couple said common point to said base contact so that when a high impedance signal is applied to said second gate contact, the potential of said common point follows the potential of said second gate contact to provide a signal for amplification by said bipolar transistor means; and means to derive an output signal from said bipolar transistor means.

3. Electronic apparatus capable of amplifying a high impedance input signal comprising: first and second unipolar transistor means and a plurality of bipolar transistor means; each of said unipolar transistor means having a channel region and a gate region forming a p-n junction with said channel region; means to make contact to each of said gate regions to provide first and second gate contacts and to two separate portions of each of said channel regions to provide a first source contact and a first drain contact on said first unipolar transistor means and a second source contact and a second drain contact on said second unipolar transistor means; said plurality of bipolar transistor means each having a base region and emitter and collector regions each forming a p-n junction with said base region; means to make contact to each of said base, emitter and collector regions to provide base, emitter and collector contacts; said plurality bipolar transistor means being electrically coupled in cascade with the emitter contact of a first bipolar transistor means conductively connected to the base contact of the second bipolar transistor means; means to conductively connect said first gate contact to said first source contact; means to conductively connect said first drain contact to said second source contact to provide a common point; means to electrically couple said common point to said base contact of said first bipolar transistor means so that when a high impedance signal is applied to said second gate contact a signal is provided at said common point for amplification by said plurality of bipolar transistor means to provide an amplified output signal at said collector contact of the last of said bipolar transistor means in said cascade.

4. Electrical apparatus capable of amplifying a high impedance input signal comprising: first and second unipolar transistor means and at least one bipolar transistor means; said first and second unipolar transistor means being disposed within a single unitary body of semiconductive material to provide substantially matching characteristics and each having a channel region and a gate region forming a p-n junction with said channel region; means to make contact to each of said gate regions to provide first and second gate contacts and to two separate portions of each of said channel regions to provide first source contact and a first drain contact on said first unipolar transistor means and a second source contact and a second drain contact on said second unipolar transistor means; said at least one bipolar transistor means having a base region and emitter and collector regions each forming a p-n junction with said base regions; means to make contact to each of said base, emitter and collector regions to provide base, collector and emitter contacts; means to conductively connect said first gate contact to said first source contact; means to conductively connect said first drain contact to said second source contact to provide a common point and means to electrically couple said common point to the base contact of said at least one bipolar transistor means so that when a high impedance signal is applied to said second gate contact, the potential of said common point follows the potential of said second gate contact to provide a signal for amplification by said bipolar transistor means.

5. Electronic apparatus capable of amplifying a high input impedance signal comprising: a unitary body of semiconductive material providing a plurality of electronic functions including a first and a second unipolar transistor means and at least one bipolar transistor means; each of said unipolar transistor means having a channel region and a gate region forming a p-n junction with said channel region and providing substantially matched characteristics; means to make contact to each of said gate regions to provide first and second gate contacts and to two separate portions of each of said channel regions to provide a first source contact and a first drain contact on said first unipolar transistor means and a second source contact and a second drain contact on said second unipolar transistor means; said bipolar transistor means having a base region and emitter and collector regions each forming a p-n junction with said base regions; means to make contact to each of said base, emitter and collector regions to provide base, emitter and collector contacts; means to conductively connect said first gate contact to said first source contact; means to conductively connect said first drain contact to said second source contact to provide a common point and means to electrically couple said common point to one of said bipolar transistor contacts so that when a high impedance signal is applied to said second gate a modulated current is provided at said common point for amplification by said bipolar transistor means.

6. In a unipolar-bipolar semiconductor amplifier: a bipolar transistor amplifier; means to bias the input of said bipolar transistor amplifier including a first unipolar transistor so connected that the direction of current carrier flow therethrough is toward said input of said bipolar transistor amplifier; means to provide a high input impedance to said bipolar transistor amplifier including a second unipolar transistor so connected that the direction of current carrier flow therethrough is away from said input of said bipolar transistor amplifier, said first and second unipolar transistors being serially connected with the common point therebetween connected to said input of said bipolar transistor amplifier; said first unipolar transistor having a gate contact permitting control of current carrier flow through said first unipolar transistor, means to apply a subtantially fixed potential to said gate contact to make said current carrier flow substantially constant; said second unipolar transistor having a gate contact permitting control of current carrier flow through said second unipolar transistor, and means to apply a signal to said gate contact to drive said input of said bipolar transistor amplifier.

7. In a unipolar-bipolar semiconductor amplifier: a bipolar transistor amplifier having an input terminal, an output terminal and a fixed reference potential terminal; first and second unipolar transistors each having gate, source and drain contacts; the drain contact of said first unipolar transistor and the source contact of said second unipolar transistor being conductively interconnected with said input terminal of said bipolar transistor amplifier; the gate and source contacts of said first unipolar transistor being conductively interconnected to provide a substantially constant bias on said input terminal upon application of a supply voltage across said first and second unipolar transistors; the gate contact of said second unipolar transistor receiving input signals that drive the input terminal of said bipolar transistor amplifier.

References Cited by the Examiner

UNITED STATES PATENTS

| | | | |
|---|---|---|---|
| 2,864,904 | 12/58 | Jensen | 330—19 |
| 2,995,712 | 8/61 | Montgomery | 330—32 X |
| 3,070,762 | 12/62 | Evans | 330—38 |
| 3,135,926 | 6/64 | Bockemuehl | 330—18 X |

OTHER REFERENCES

Huang et al.: "Field Effect Transistor Circuit Design (11-applications)," Electronics Design, October 1955, pp. 42–45.

Schwartz: "Integrated Circuit Package," IBM Technical Disclosure Bulletin, May 1961, vol. 3, No. 12, pp. 26–27.

Szekley: "Integrated Linear Audio Frequency Amplifier," RCA Technical Notes, No. 454, September 1961, Sheets 1 and 2.

ROY LAKE, *Primary Examiner.*

NATHAN KAUFMAN, *Examiner.*